(12) United States Patent
Jansa et al.

(10) Patent No.: US 6,218,790 B1
(45) Date of Patent: Apr. 17, 2001

(54) CONNECTION ASSEMBLY WITH SELECTIVE ESTABLISHMENT OF INTENSITY OF LIGHT-EMITTING DIODE

(75) Inventors: Frank Jansa, Frankfurt; Helmut Olbrich, Darmstadt; Heinrich Noll, Gross-Umstadt; Michael Vogel, Frankfurt, all of (DE)

(73) Assignee: Mannesmann Vdo AG, Frankfurt (DE)

( * ) Notice: Subject to any disclaimer, the term of this patent is extended or adjusted under 35 U.S.C. 154(b) by 0 days.

(21) Appl. No.: 09/259,024

(22) Filed: Feb. 26, 1999

(30) Foreign Application Priority Data

Mar. 11, 1998 (DE) .............................. 198 10 308
Apr. 1, 1998 (DE) .............................. 198 14 495

(51) Int. Cl.$^7$ ...................................... G05F 1/00
(52) U.S. Cl. ......................... 315/291; 315/363; 362/800
(58) Field of Search ................... 315/291, 293, 315/306, 307, 308, 310, 313, 314, 315, 320, 321, 119, 120, 292, 294, 295, 225; 362/800

(56) References Cited

U.S. PATENT DOCUMENTS

| 4,217,625 | * | 8/1980 | Klein ........................ 362/30 |
| 4,314,234 | * | 2/1982 | Darrow et al. ............. 340/825.36 |
| 4,604,499 | * | 8/1986 | Hughes ..................... 179/2 DP |
| 5,047,761 | * | 9/1991 | Sell ......................... 340/815.1 |
| 5,078,079 | * | 1/1992 | Ohta et al. ................ 116/288 |
| 5,704,151 | * | 1/1998 | West et al. ................ 42/70.07 |
| 5,724,458 | * | 3/1998 | Katoh et al. .............. 382/312 |
| 5,834,750 | * | 11/1998 | Coleman et al. .......... 235/455 |
| 5,869,776 | * | 2/1999 | Vuong et al. ............. 73/866.3 |
| 5,895,115 | * | 4/1999 | Parker et al .............. 362/511 |

* cited by examiner

Primary Examiner—Don Wong
Assistant Examiner—Tuyet T. Vo
(74) Attorney, Agent, or Firm—Martin A. Farber

(57) ABSTRACT

In order to code its light intensity class, a light-emitting diode (1) has a number of contact elements (3–8) which are connected to series resistors (13–16) situated outside a physical unit comprising the contact elements (3–8), a connection element (2) and the light-emitting diode (1). Depending on the code, series resistors (13–16) are combined and thus compensate for the fluctuations in light intensity which are unavoidable in light-emitting diode manufacture. The light-emitting diode (1) is therefore automatically connected to the requisite series resistor (13–16) by connecting the connection element (2).

18 Claims, 2 Drawing Sheets

CONNECTION ASSEMBLY WITH SELECTIVE ESTABLISHMENT OF INTENSITY OF LIGHT-EMITTING DIODE

FIELD AND BACKGROUND OF THE INVENTION

The invention relates to a light-emitting diode having a code, particularly for different light intensity classes, and having a connection element with at least two electrical contact elements for connecting a power supply.

Such light-emitting diodes (LED) are frequently used in practice for illumination in the area of the dashboard of a motor vehicle and serve as a signal or monitor light, for example, but also, to an increasing extent, for illuminating instrument dials. Light-emitting diodes are used in preference on account of their low susceptibility to faults in comparison to incandescent lamps, as well as their relatively low power consumption. Contributions in this area have been provided not only by the achievement of virtually any desired colors, but also, above all, by a considerable increase in light intensity. It is already possible to obtain light-emitting diodes whose light intensity is sufficient for motor vehicle brake lights to be equipped with them, for example.

Difficulties with the use of light-emitting diodes are, in practice, caused by the light intensity, which cannot be defined exactly in advance in the manufacturing process. Hence, the light intensities of different diodes, which may even come from the same batch, for example, fluctuate despite constant voltage and current consumption. This causes considerable problems, depending on the area of application. For example, reading accuracy is impaired in those display devices equipped with such light-emitting diodes, and these fluctuations in the brightness of a number of light-emitting diodes arranged next to one another create an inferior impression.

Attempts have hitherto been made to counter this problem by measuring the light intensity of the different light-emitting diodes during the manufacturing process and then providing the light-emitting diodes with a code denoting the light intensity class. In this context, the code usually comprises a bar code which is attached to the light-emitting diode or to a connection element connected to the light-emitting diode. When the light-emitting diode is being fitted, the code is then read first of all and, depending on the light intensity class, a series resistor is selected and connected upstream of the light-emitting diode, so that the light intensity of different light-emitting diodes of one type is guaranteed to be approximately constant.

In this case, a particular disadvantage is the considerable effort which is necessary to detect the bar code and then to connect an appropriate series resistor upstream of the light-emitting diode. Furthermore, in the event of any replacement being necessary, the series resistor and the light-emitting diode always have to be replaced together on account of being individually matched to one another. Alternatively, additional outlay is involved in the manufacture of the component having the light-emitting diode, since the light-emitting diode and the corresponding series resistor form an inseparable unit.

It might be conceivable to integrate an appropriate series resistor during the actual manufacture of the light-emitting diode. However, this causes the range of applications to be limited straight away by the change in dimensions compared with known light-emitting diodes, in particular.

SUMMARY OF THE INVENTION

The invention is therefore based on the object of designing a light-emitting diode such that different possible light intensity classes of the light-emitting diode can be compensated for, during fitting, automatically, i.e. without the code being read beforehand and the appropriate series resistor subsequently being selected and fitted.

The invention achieves this object in that the connection element has at least one further electrical contact element and in that the code is produced by using the at least one further contact element either to make or break an electrical connection. As a result, simply by connecting the contact elements, the light-emitting diode is connected just to that electrical or electronic component which is suitable for compensating for the light intensity class. This means that prior detection of a bar code is not necessary. The electrical or electronic components necessary to compensate for the light intensity classes of the different light-emitting diodes can thus at this stage be permanently fitted to the components to be connected to the light-emitting diode, e.g. a printed circuit board in a combined instrument in a motor vehicle, and are connected automatically by means of the contact elements on the basis of the light intensity class defined by the code. In addition, any replacement of light-emitting diodes which may be necessary is simplified considerably because the light intensity class of the new light-emitting diode is detected and corrected automatically. It is therefore not necessary to know the light intensity class of the original light-emitting diode, which makes it possible for even a layman to carry out the replacement.

A particularly simple embodiment of the invention is provided here if at least one of the contact elements is connected to a series resistor. In comparison to known light-emitting diodes in which the corresponding series resistor is fitted specifically for the light-emitting diode, any series resistor likely to be needed is already available in the context of the present invention. The series resistor to be connected to the light-emitting diode is governed by the coding of the contact elements.

The components necessary to compensate for the light intensity could be integrated in a coupling element compatible with the connection element. It is particularly advantageous, however, if the light-emitting diode is connected to a ribbon conductor or printed circuit board. As a result, the components can to a large extent be prefitted and standardized. This allows greater quantities to be achieved and at the same time manufacturing costs to be reduced. It is then also a simple matter to arrange a number of light-emitting diodes together for the purpose of increasing the light intensity, and accordingly to provide them with a single code. Advantageously, these combined light-emitting diodes are all in the same light intensity class.

Another, particularly advantageous embodiment of the invention is provided if the code is designed so that it can be read by a control element. In this case, the code is first of all detected by means of the control element, and is used to determine the data necessary to compensate for the light intensity. The current required to operate the light-emitting diode can therefore be introduced independently of the circuit required for detecting the code. Hence, faulty contact elements do not cause failure of the power supply to the light-emitting diode. Furthermore, light intensity classes of other light-emitting diodes can also be detected and compared with one another in a single central control element.

Matching the light intensity class, as is necessary in this arrangement, can be achieved particularly easily if the light-emitting diode has a series resistor which can be connected upstream as a function of the code, using the control element. This enables a high degree of operational reliability to be achieved. At the same time, this arrangement makes it possible to provide a common series resistor when using a number of light-emitting diodes of the same light intensity class.

A particularly advantageous development allows operation without a series resistor if the power supply for the light-emitting diode can be set as a function of the code, using the control element. In this arrangement, pulse width control, in preference, ensures that the power supply is matched to the respective light intensity class of the light-emitting diode. There is therefore no need for any additional series resistors.

Another advantageous development of the invention is provided if the code is produced by interrupting electrical connections between individual contact elements or by interrupting electrical connections between the light-emitting diode and contact elements. In this context, all the electrical connections between contact elements can initially be closed in the manufacturing process. After the light intensity has been measured, it is then possible for individual or else a number of electrical connections to be broken, and thus for a code to be produced. For example, the contact elements and their connections to one another may also comprise a flexible printed circuit or a ribbon conductor whose conductor tracks can be interrupted simply by stamping out or punching, so that rapid and reliable coding can be carried out.

According to a particularly advantageous development of the invention, the light-emitting diode is connected to a pointer of a dial instrument such that they rotate together. In this way, the light-emitting diode can be used for active illumination of the pointer, thus considerably increasing the perceptibility of the latter, particularly at night. The code, which may be analog or digital, reliably ensures that the illumination of the pointer has a predefined brightness. In this embodiment, it is particularly advantageous if the light-emitting diode is electrically connected to a ribbon conductor for supplying electrical power, since the ribbon conductor affords wear-free contact with the light-emitting diode, and also does not impede rotary movement of the pointer.

BRIEF DESCRIPTION OF THE DRAWINGS

The invention supports numerous embodiments. To clarify the basic principle of the invention further, one of these is illustrated in the drawing and is described below. In the drawing.

DETAILED DESCRIPTION OF THE PREFERRED EMBODIMENTS

Figure 1:
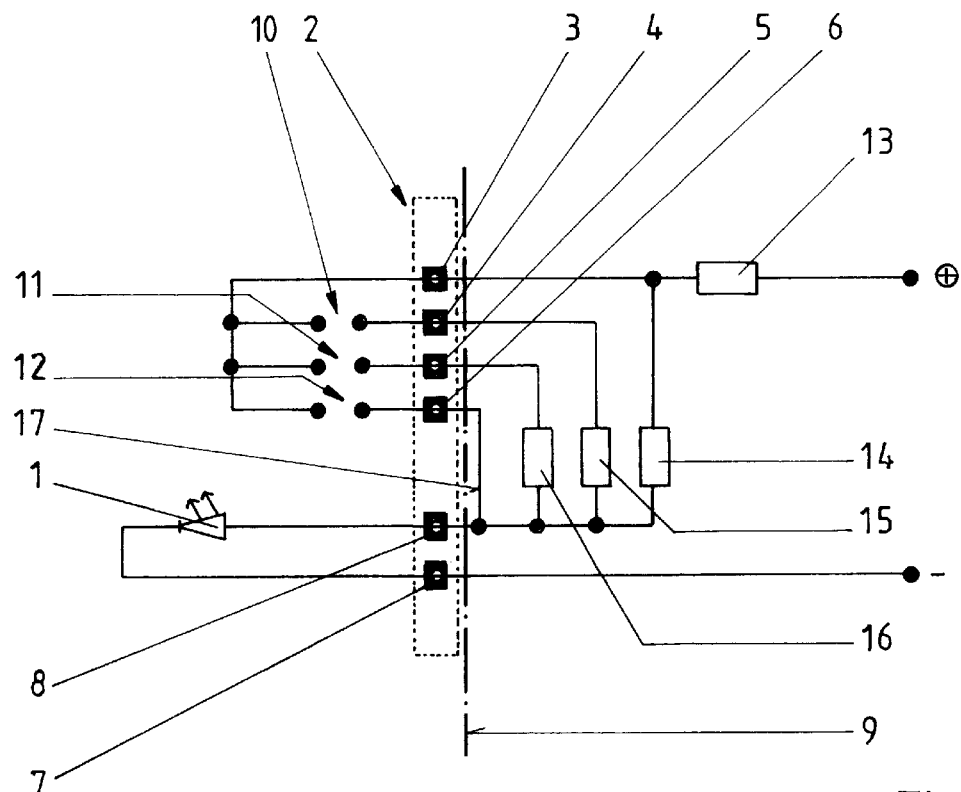
FIG. 1 shows a circuit diagram of a light-emitting diode according to the invention, having a number of series resistors.

FIG. 1 shows a circuit diagram of a light-emitting diode 1 according to the invention. A separating line 9 (shown by dashed lines) runs along a connection element 2 (shown only schematically) which has six contact elements 3–8. Together with the contact elements 3–8 arranged inside the connection element 2, which is designed as a male connector, the light-emitting diode 1 forms a physical unit which is arranged such that it can be mechanically separated from the remaining components along the separating line 9, which symbolizes a plug connection. The physical unit, which is formed, for example, from a flexible ribbon conductor with which the light-emitting diode 1 makes contact and which is provided with the male connector, additionally comprises electrical contact points 10, 11, 12, which are interrupted in the embodiment shown and thus define a code for the light intensity class of the light-emitting diode 1. The light-emitting diode 1 has two series-connected series resistors 13 and 14 connected upstream of it. If one or more of the contact points 10, 11 or 12 are closed, then the total resistance is reduced. Codes produce an electrical connection to series resistors 15, 16, for example, or enable a direct connection 17. The series resistors 13–16 are in this case arranged outside the physical unit of the contact elements 3–8, connected to the light-emitting diode 1, and the connection element 2, e.g. on a printed circuit board, and therefore do not have to be removed if the light-emitting diode 1 is replaced. It can be seen that the contact elements 7, 8 are used for directly supplying electrical power to the light-emitting diode 1, whereas the contact elements 3–6 are used to produce the code.

Figure 2:
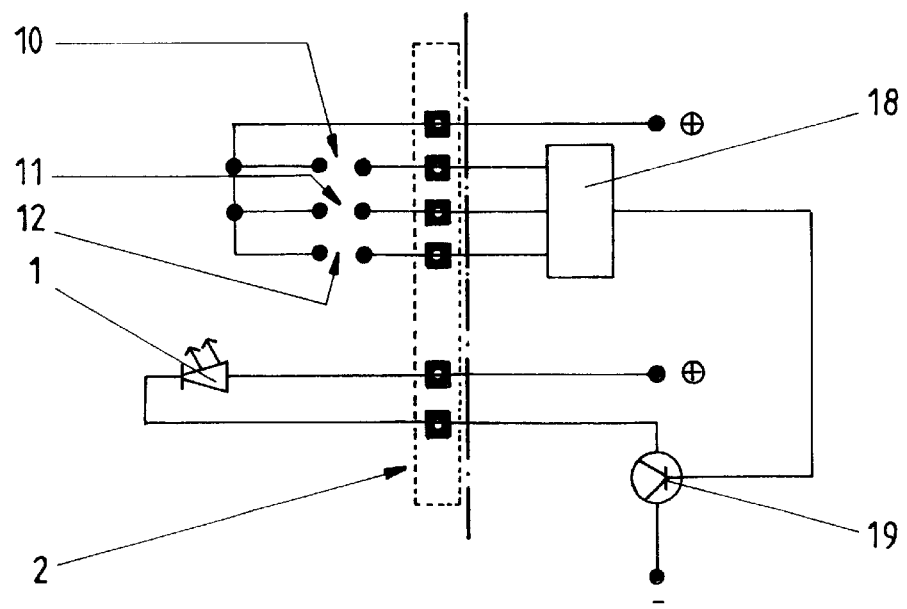
FIG. 2 shows a circuit diagram of the light-emitting diode according to the invention, having a control element connected.

FIG. 2 shows a circuit diagram of the light-emitting diode 1 illustrated in FIG. 1, which is in this case connected by means of the connection element 2 to a control element 18 in the form of a logic circuit. In this case, the control element 18, e.g. a microprocessor, recognizes the code, produced as a result of the contact points 10, 11, 12 being interrupted, for the light intensity class of the light-emitting diode 1 and thus uses an electronic component 19 in the form of a transistor to control the power supply, for the light-emitting diode 1, which is necessary for the appropriate light intensity class.

Figure 3:
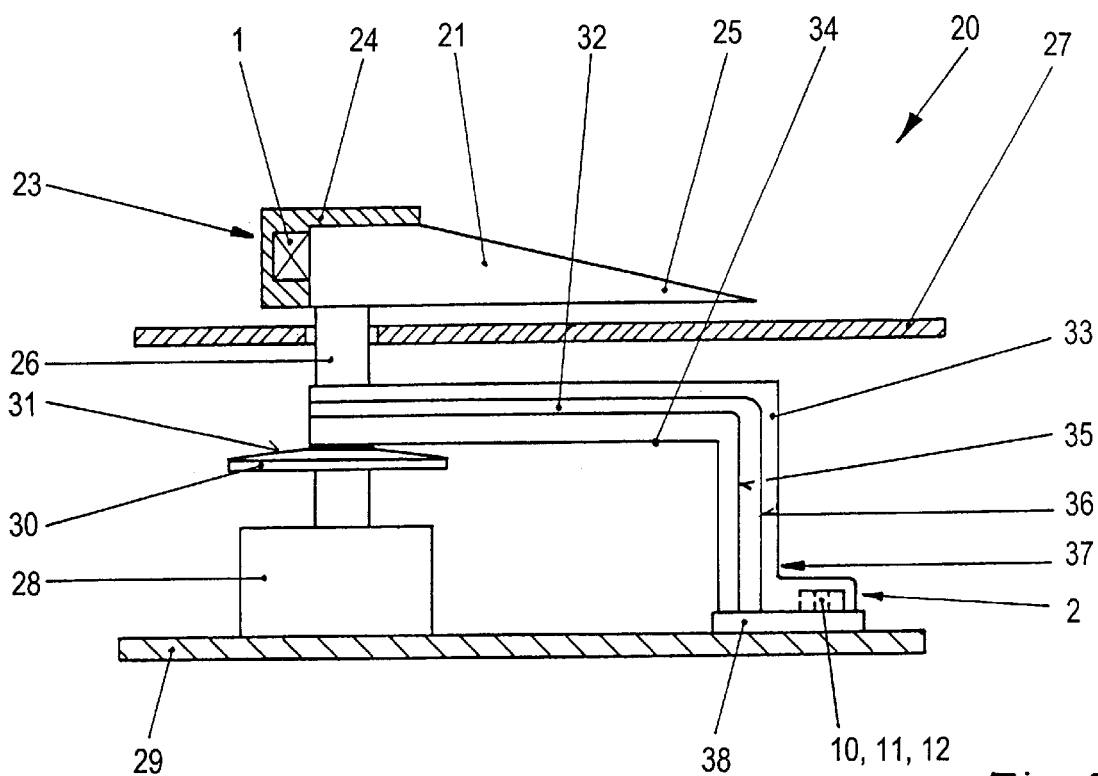
FIG. 3 shows a sectional side view of a dial instrument having a light-emitting diode according to the invention.

FIG. 3 shows a simplified illustration of a dial instrument 20 with a pointer 23 which has a pointer needle 21. This pointer needle 21 is illuminated with light from a light source in the form of a light-emitting diode 1, said light source being concealed from any observer by a cap 24. The bottom of the pointer needle 21 is connected, at its end opposite a pointer tip 25, to a pointer shaft 26 which passes through an instrument dial 27 and can be deflected by means of a pointer drive 28 in the form of a measuring unit. Between a printed circuit board 29, to which the pointer drive 28 is fitted, and the instrument dial 27, the pointer shaft 26 has a flange-like projection 30 which has a beveled surface 31 dropping toward the outside. A portion of a central region 32, which can be coiled up, of a ribbon conductor 33 passing spirally around the pointer shaft 26 and having a lower lateral edge 34 bears against the projection 30. The ribbon conductor 33, which is provided with two conductor tracks 35, 36 for connecting the light-emitting diode 1 to a power supply, is carried outward approximately at right angles to the pointer shaft 26 and, in its end region remote from the pointer shaft 26, has a reinforced portion 37 which points downward. This reinforced portion 37 has a connection element 2 in the form of a plug connection 38, and this plug connection 38 is used to connect the foil 33 to the printed circuit board 29 forming the power supply. The integral connection of the foil 33 to the light-emitting diode 1, which connection runs in a recess in the pointer shaft 26, is not shown.

Contact points 10, 11, 12 defining a code for the light-emitting diode 1 are arranged in the region of the plug connection 38 and, as shown in FIG. 1, are connected to contact elements (not shown here) arranged inside the connection element 2. Contact elements which likewise are not shown (in FIG. 3) and are arranged inside the connection element 2, and which correspond to the contact elements 7, 8 in FIG. 1, are connected to the conductor tracks 35, 36 and supply the light-emitting diode 1 with electrical power.

What is claimed is:

1. A connection assembly including an electric circuit for establishing illumination intensity of a light-emitting diode, the circuit comprising a set of closeable electric contact points operative as a code for establishing a value of current energizing the diode to produce illumination, wherein each of a plurality of values of codes identifies a different value of the current energizing, the diode energized by the circuit being suitable for use in different light intensity classes, the assembly having a connection element with at least two electrical contact elements for connecting the diode via the circuit to a power supply, wherein the connection element comprises at least one further electrical contact element, respective ones of the contact points of said set of contact points connecting respectively with said at least one further contact element, and the code is produced by the at least one further contact element, and is operative either to make or break an electrical connection.

2. The light-emitting diode as claimed in claim 1, wherein the circuit includes a series resistor connected in series with the diode, and at least one of the contact elements is operative to form the code upon connection to the series resistor.

3. The light-emitting diode as claimed in claim 1, wherein the light-emitting diode is connected to a ribbon conductor or printed circuit board.

4. The light-emitting diode as claimed in claim 1, wherein the code is produced by interrupting electrical connections between individual ones of the contact elements or by interrupting electrical connections between the light-emitting diode and one of the contact elements.

5. The light-emitting diode as claimed in claim 1, wherein the light-emitting diode is connected to a pointer of a dial instrument such that they rotate together.

6. The light-emitting diode as claimed in claim 5, wherein the light-emitting diode is electrically connected to a ribbon conductor.

7. The light-emitting diode as claimed in claim 1, wherein the circuit includes a control element connecting with a contact element of the connection element, and the code is designed so that it can be read by the control element.

8. The light-emitting diode as claimed in claim 7, wherein the circuit has a series resistor which can be connected upstream as a function of the code, using the control element.

9. The light-emitting diode as claimed in claim 7, wherein the control element is operative for setting the power supply for the light-emitting diode as a function of the code.

10. A system having a connection assembly including an electric circuit for establishing illumination intensity of a light-emitting diode, the circuit comprising a set of closeable electric contact points operative as a code for establishing a value of current energizing the diode to produce illumination, wherein each of a plurality of values of codes identifies a different value of the current energizing the diode energized by the circuit being suitable for use in different light intensity classes, and having a connection element with at least two electrical contact elements for connecting the diode via the circuit to a power supply, wherein the connection element comprises at least one further electrical contact element, respective ones of the contact points of said set of contact points connecting respectively with said at least one further contact element, and the code is produced by the at least one further contact element, and is operative either to make or break an electrical connection; and wherein the circuit comprises a set of resistors interconnecting, via one of the electrical contact elements, a terminal of the diode to a terminal of the power supply by said at least one further electrical contact element, upon connection of the circuit to the power supply; and the code is implemented by a preset selection of the resistors by a set of electrical connections established by selective closures of said contact points.

11. The system as claimed in claim 10, wherein at least one of the contact elements is operative to form the code upon connection to a series resistor of the set of resistors.

12. The system as claimed in claim 10, wherein the light-emitting diode is connected to a ribbon conductor or printed circuit board of the circuit.

13. The system as claimed in claim 10, wherein the circuit includes a control element connecting with a contact element of the connection element, and the code is designed so that it can be read by a control element.

14. The system as claimed in claim 10, wherein the set of resistors has a series resistor which can be connected upstream as a function of the code, using the control element.

15. The system as claimed in claim 10, wherein connection of the power supply to the light-emitting diode is set as a function of the code, using the control element.

16. The system as claimed in claim 10, wherein the code is produced by interrupting electrical connections between individual contact elements or by interrupting electrical connections between the light-emitting diode and contact elements within the diode assembly.

17. The system as claimed in claim 10, wherein the light-emitting diode is connected to a pointer of a dial instrument such that they rotate together.

18. The system as claimed in claim 17, wherein the light-emitting diode is electrically connected to a ribbon conductor.

* * * * *